United States Patent [19]

Yokoyama et al.

[11] Patent Number: 4,607,222

[45] Date of Patent: Aug. 19, 1986

[54] IMAGING REGION-OF-INTEREST IN MEDICAL NMR OBSERVATION

[75] Inventors: Tetsuo Yokoyama, Tokyo; Koichi Morishita, Kawasaki; Koichi Sano, Yokohama; Shimbu Yamagata, Kawasaki; Akira Ogushi, Matsudo, all of Japan

[73] Assignees: Hitachi, Ltd.; Hitachi Medical Corporation, both of Tokyo, Japan

[21] Appl. No.: 578,790

[22] Filed: Feb. 10, 1984

[30] Foreign Application Priority Data

Feb. 10, 1983 [JP] Japan .................................. 58-19815

[51] Int. Cl.⁴ .......................................... G01R 33/20
[52] U.S. Cl. ...................................... 324/309; 324/307
[58] Field of Search ................. 324/300, 307, 309, 311

[56] References Cited

U.S. PATENT DOCUMENTS

| | | | |
|---|---|---|---|
| 4,340,862 | 7/1982 | Percival | 324/309 |
| 4,486,708 | 12/1984 | Macovski | 324/309 |
| 4,509,011 | 4/1985 | Sugimoto | 324/309 |
| 4,520,316 | 5/1985 | Hall et al. | 324/309 |

OTHER PUBLICATIONS

P. Mansfield et al., Biological and Medical Imaging by NMR, J. of Mag. Res., 29, 355-373 (1978).

Primary Examiner—Michael J. Tokar
Attorney, Agent, or Firm—Antonelli, Terry & Wands

[57] ABSTRACT

A step of changing the frequency of a rotational field for nuclear magnetic resonance measurement of a medical nuclear magnetic resonance imaging apparatus is set to be smaller in a region of interest in a cross-section of an object to be examined than that in regions of less interest. In the less interesting regions of less interest, the spatial sampling interval is made large and an interpolating calculation is performed for the obtained projection data to provide data at the same spatial interval. The image reconstruction can be performed using an ordinary image reconstruction algorithm.

6 Claims, 8 Drawing Figures

IMAGING REGION-OF-INTEREST IN MEDICAL NMR OBSERVATION

BACKGROUND OF THE INVENTION

1. FIELD OF THE INVENTION

The present invention relates to an imaging method of a nuclear magnetic resonance (NMR) imaging apparatus for medical diagnosis.

2. DESCRIPTION OF THE PRIOR ART

Nuclear magnetic resonance which was independently originated by Bloch and Purcell in 1946 has been rapidly developed since then and has become an extremely effective tool for structural analysis of an organic compound and for study of material science. An apparatus for imaging proton spin density in a section of human body using this technology of Nuclear Magnetic Resonance (hereinbelow, abbreviated as NMR) is called an NMR imaging apparatus.

In a conventional apparatus, the frequency of the rotational magnetic field is varied at regular frequency intervals, thereby performing the image reconstruction from the projection data at cross-sections of regular spatial intervals, in the same manner as in an X-ray CT scanner. Therefore, even for a demand for imaging only a Region Of Interest (hereinbelow, abbreviated as ROI) in such cases as one desires to know a change of only the region of interest after an operation prescription, the image reconstruction of the whole transverse sections has been performed, so that it has been necessary to take several minutes to measure the projection data for one sheet of picture image. In addition, there is a large possibility that a human body moves during this several minutes resulting in deterioration in the quality of a resultant picture.

SUMMARY OF THE INVENTION

It is an object of the present invention to overcome the above-mentioned drawback and to provide an imaging method by which in case of imaging a region of interest, a transverse sectional image of a human body can be measured in a time period which is no longer than one half of an ordinary time period with a good resolution in the region of interest although a resolution out of the region of interest is not very good, thereby enabling the image reconstruction to be performed using its measurement data.

To accomplish the above object, the present invention has a feature such that sampling intervals in the region of interest and its circumference are set to be shorter, while sampling intervals of other projection data are set to be longer, and upon calculation for reconstruction, the portion having a longer sampling interval of the projection data is sampling-processed by means of interpolation, thereby performing the image reconstruction by applying a conventional image reconstruction algorithm.

DESCRIPTION OF THE PREFERRED EMBODIMENT

Figure 1A:
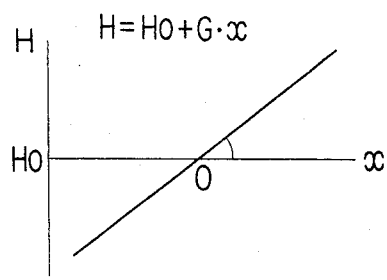
FIGS. 1a to 1c and 2 are diagrams showing principles of imaging an object by nuclear magnetic resonance.

The principle of an NMR imaging apparatus is disclosed in detail in an article "Biological and Medical Imaging by NMR" by Mansfield and Pykett; Journal of Magnetic Resonance, vol. 29, pp. 355–373 (1978) and will be described briefly referring to FIGS. 1a to 1c and 2. A static magnetic field H comprising a gradient magnetic field $G \cdot x$ having a spatial gradient G in the direction of x as well as a uniform magnetic field $H_0$ is applied to a human body. Then, the static magnetic field H applied to the human body can be represented by $$H = H_0 + G \cdot x \tag{1}$$

as shown in FIG. 1a. For such gradient static field, a resonance frequency of the rotational field becomes a function of position x and can be represented by $$\omega = \gamma H = \gamma H_0 + \gamma G \cdot x = \omega_0 + \gamma G \cdot x \tag{2}$$

where, $\omega_0 = \gamma H_0$, and $\gamma$ denotes a physical quantity which is unique to respective nuclear species and is called a gyromagnetic ratio. Equation (2) can be rewritten as $$x = (\omega - \omega_0)/\gamma G \tag{2'}$$

Figure 1B:
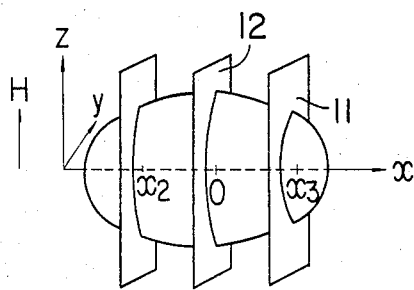
Figure 1C:
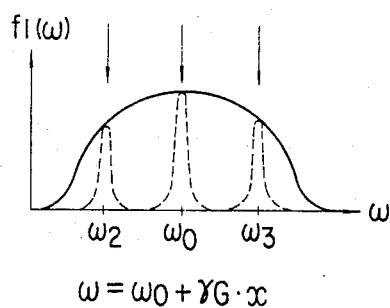

When a rotational magnetic field $H_1(\omega)$ is applied to an object 11 to be tested in the xy plane as in FIG. 1b to measure an absorption spectrum, resonance occurs only at such positions where the frequency $\omega$ matches the resonance frequency $\omega$ of equation (2) and a resonance signal is obtained only from the spin group in the corresponding plane 12 of $x = (\omega - \omega_0)/\gamma G$ as shown in FIG. 1c. Therefore, the absorption frequency spectrum $f_1(\omega)$ to be measured will be given by $$f_1(\omega) = \int\int \rho(x,y,z)\, dy\, dz \tag{3}$$

using a spin density function $\rho(x,y,z)$.

A behavior of $f_1(\omega)$ with respect to $\omega$ is as shown in FIG. 1c. Substituting equation (2), we have $$f_1(\omega_0 + \gamma G \cdot x) = \int\int \rho(x,y,z)\, dy\, dz \tag{4}$$

When the quantities $\omega_0$, $\gamma$ and G are constant, the left side is a function of x, f(x), and we have $$f(x) = \int\int \rho(x,y,z)\, dy\, dz \tag{5}$$

Figure 2:
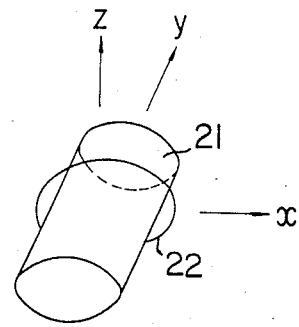

If a width or the number of turns of a coil 22 is reduced (e.g. to one turn) relative to the object 21 to be tested, the position in the direction of y can be geometrically determined by the position of the coil as shown in FIG. 2. Thus, we have $$f(x) = \int \rho(x,z)\, dz \tag{6}$$

Namely, the absorption spectrum f(x) to be measured becomes a line integral along the z direction of the spin density $\rho(x,z)$ in the xz plane, i.e. the projection of the spin density onto the x axis. If projections from various directions are obtained by rotating the object around the y axis or by rotating the magnetic field gradient vector $\vec{G}$, e.g. by changing the projection direction 1° for each time and 360° in total, the spin density $\rho(x,z)$ can be reconstructed due to the same transverse section reconstruction algorithm as the algorithm to be used in an X-ray CT scanner.

Figure 3:
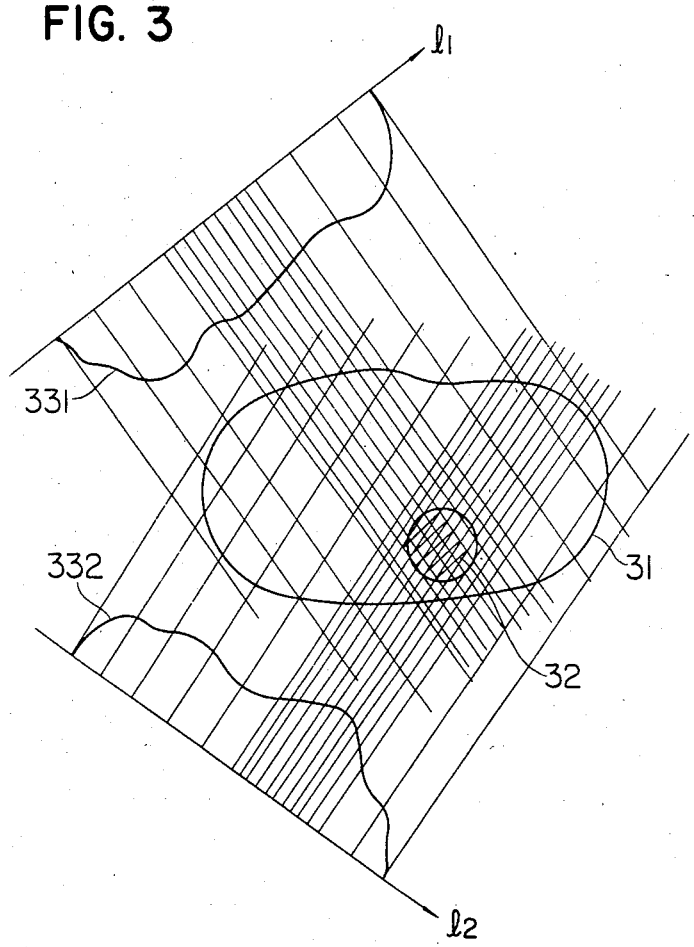
FIG. 3 is a diagram illustrating an example of spatial sampling intervals for sampling projection data according to the present invention.

FIG. 3 illustrates the state in that projection data 331 on the length $l_1$ and projection data 332 on the length $l_2$ are obtained by setting the sampling spatial intervals shorter in a region of interest 32 than the peripheral regions in a section 31 of an object to be tested (e.g. a human body).

Figure 4:
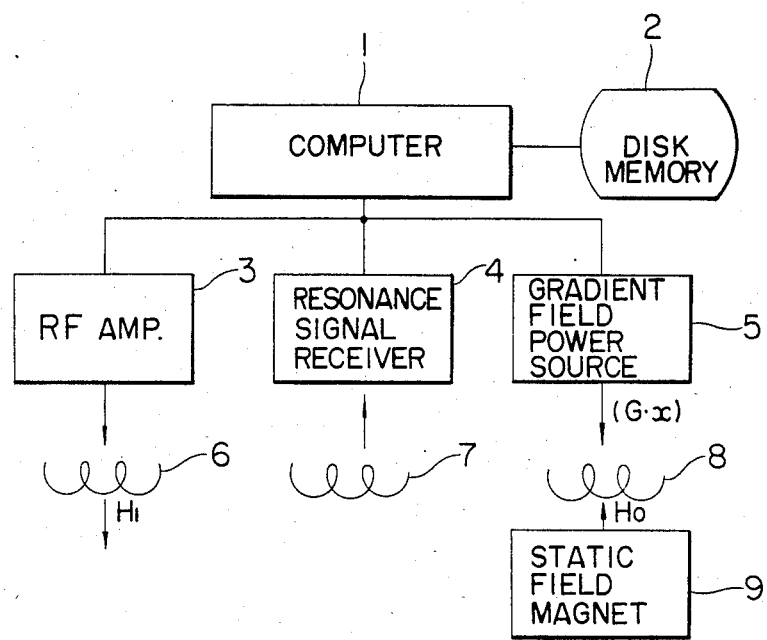
FIG. 4 is a block diagram showing an NMR imaging apparatus according to an embodiment of the present invention.
Figure 5:
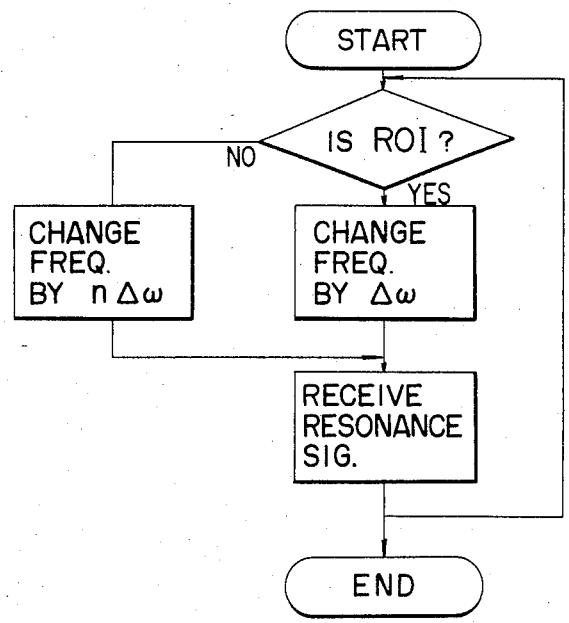
FIG. 5 is a flowchart showing the procedure to change the sampling frequency intervals according to an embodiment of the present invention.

An embodiment of the present invention will now be described hereinbelow with reference to FIGS. 4–6. FIG. 4 is a block diagram showing main constituents of an NMR imaging apparatus. A gradient magnetic field G·x is superposed on a region where a static field magnet 9 produces a static magnetic field $H_0$, by feeding a current from a power supply 5 for a gradient magnetic field to a coil 8 for a gradient magnetic field. The rotational magnetic field $H_1$ is produced by feeding a current from an RF amplifier 3 to a transmitter coil 6. A resonance signal produced thereby is picked up by a receiver coil 7 and detected in a resonance signal receiver 4.

The RF amplifier 3 and power supply 5 for the gradient magnetic field are controlled by a computer 1 and the resonance signal detected in the resonance signal receiver 4 is also supplied to the computer 1 and stored in a disk memory 2 as projection data. There are also provided input means (e.g. keyboard) and output means (e.g. display) combined with or separated from the computer 1 for selecting the scan range and the ROI range and the resolutions (spatial sampling interval) thereof. The spatial interval may be transformed into the frequency changing interval in the computer 1. A memory disk 2 provides a desired storage capacity. The position of projection data to be measured is selected by shifting the rotational frequency $\omega$ by the units of a small amount of frequency ($\Delta\omega$) at a time as shown in FIG. 1c. The projection data including a fine sampling interval and a coarse sampling interval or intervals as shown in FIG. 3 can be measured by changing this rotational frequency $\omega$ under control of the computer 1 in accordance with the procedure shown in FIG. 5. For example, referring to FIG. 3, in the section 31 of an object to be measured, the rotational frequency $\omega$ is changed at a frequency changing interval of $\Delta\omega$ for the region of interest 32, but in other regions, the rotational frequency $\omega$ is changed at a frequency changing interval of n times (n>1) as much as $\Delta\omega$. Then, the projection data 331 and 332 having a high resolution in the region of interesting as shown in FIG. 3 can be obtained along the lengths $l_1$ and $l_2$.

Figure 6:
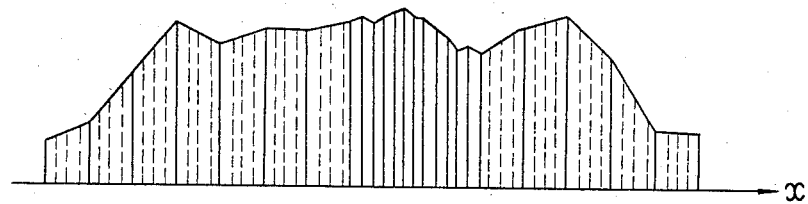
FIG. 6 is a diagram showing an example of positional relationship between measured data and interpolated data.

Upon image reconstruction, by firstly performing the interpolation processing of the measured projection data at the spatial intervals corresponding to the frequency changing intervals indicated by the solid lines as shown in FIG. 6, the interpolation data indicated by the broken lines are obtained at the same spatial interval. Then, it becomes possible to utilize the reconstruction algorithm such as a Filtered Back Projection Method or the like which is broadly used in an X-ray CT apparatus. The interpolation processing is executed for the portion where the projection data is obtained at a coarse interval of n $\Delta\omega$, where n is an integer larger than 1. In FIG. 6, the interpolation processing when n=4 is shown.

According to the present invention, in case of imaging a ROI by a medical nuclear magnetic resonance imaging apparatus, the imaging time, which has been conventionally several minutes, can be reduced to one half or shorter and it is possible to decrease a burden to a patient when a number of sectional images are imaged, and at the same time there is an effect such that deterioration of picture quality due to the movement of a human body can be prevented.

We claim:

1. An imaging method of a region of interest for a medical nuclear magnetic resonance (NMR) imaging apparatus by a projection reconstruction method, said imaging method comprising the steps of:

measuring in a desired direction nuclear magnetic resonance projection data by changing a spin resonance frequency of a rotational magnetic field for causing nuclear magnetic resonance at a first frequency changing interval for a first region on a cross-section of an object to be examined, thereby obtaining first projection data at a first spatial sampling interval corresponding to said first frequency changing interval;

measuring in said direction nuclear magnetic resonance projection data by changing said spin resonance frequency of the rotational magnetic field for causing nuclear magnetic resonance at a second frequency changing interval which is larger than said first frequency changing interval for at least one second region on said cross-section of the object to be examined outside of said first region, thereby obtaining second projection data at a second spatial sampling interval which is larger than said first spatial sampling interval; and performing interpolating calculation for said second projection data to provide interpolated data for said second region corresponding to said first spatial sampling interval.

2. An imaging method according to claim 1, wherein said second spatial sampling interval is an integer times as large as said first spatial sampling interval.

3. An imaging method according to claim 2, further comprising the steps of:

selecting a first region as a region of interest to be measured with the first spatial sampling interval; and selecting the second spatial sampling interval for second regions outside the region of interest.

4. An imaging method according to claim 3, further comprising the step of:

converting said spatial sampling interval to a corresponding frequency changing interval of a rotational magnetic field.

5. An imaging method according to claim 2, further comprising the steps of:

reconstructing an NMR image utilizing the projection data and the interpolated data.

6. An imaging method according to claim 5, wherein said interpolating calculation is performed at each position in said second region at said first spatial sampling interval at which no measurement is done.

* * * * *